(12) United States Patent
Koops

(10) Patent No.: US 7,504,644 B2
(45) Date of Patent: Mar. 17, 2009

(54) METHOD AND DEVICES FOR PRODUCING CORPUSCULAR RADIATION SYSTEMS

(75) Inventor: Hans Wilfried Peter Koops, Ober-Ramstadt (DE)

(73) Assignee: Hans Wilfried Peter Koops, Ober Ramstadt (DE)

( * ) Notice: Subject to any disclaimer, the term of this patent is extended or adjusted under 35 U.S.C. 154(b) by 340 days.

(21) Appl. No.: 10/543,175

(22) PCT Filed: Jan. 23, 2004

(86) PCT No.: PCT/EP2004/000559

§ 371 (c)(1),
(2), (4) Date: Mar. 14, 2006

(87) PCT Pub. No.: WO2004/066333

PCT Pub. Date: Aug. 5, 2004

(65) Prior Publication Data

US 2006/0192141 A1    Aug. 31, 2006

(30) Foreign Application Priority Data

Jan. 24, 2003   (DE)   ................... 103 02 794

(51) Int. Cl.
*G21G 5/00* (2006.01)
*C23F 1/00* (2006.01)
*H01B 13/00* (2006.01)

(52) U.S. Cl. ............... 250/492.22; 250/492.1; 250/492.21; 250/492.3; 216/2

(58) Field of Classification Search ............... 250/309, 250/310, 396 R, 398, 423 R, 492.1, 492.2, 250/492.21, 492.22, 492.3; 216/2, 12, 37, 216/58, 62, 63, 66; 445/35, 49, 59; 118/723 EB, 118/723 FI; 427/566, 581, 596; 438/584, 438/587
See application file for complete search history.

(56) References Cited

U.S. PATENT DOCUMENTS

| | | | |
|---|---|---|---|
| 4,226,666 A | 10/1980 | Winters | |
| 4,976,843 A * | 12/1990 | Ward et al. | ............. 204/298.36 |
| 5,055,696 A | 10/1991 | Haraichi et al. | |
| 5,113,072 A | 5/1992 | Yamaguchi et al. | |

(Continued)

FOREIGN PATENT DOCUMENTS

DE    4416597 A1    11/1995

(Continued)

OTHER PUBLICATIONS

ISR/PCTEP2004/000559, Jun. 10, 2005, Koops.

(Continued)

*Primary Examiner*—Bernard E Souw
(74) *Attorney, Agent, or Firm*—Woodling, Krust and Rust

(57) ABSTRACT

The invention pertains to a process for the production of particle beam systems (10-10'''', 12-12''), in which at least one first particle beam system (10-10'''') is produced on a first substrate (14) by computer-guided particle beam-induced deposition, and the minimum of one first particle beam system (10-10'''') is used to produce at least one second particle beam system (12-12'') on at least one second substrate (16) by computer-guided particle beam-induced deposition. The inventive process makes it possible to produce a large number of particle beam systems in a relatively short time.

20 Claims, 3 Drawing Sheets

U.S. PATENT DOCUMENTS

| | | | |
|---|---|---|---|
| 5,145,438 A | 9/1992 | Bol | |
| 5,229,320 A | 7/1993 | Ugajin | |
| 5,267,884 A | 12/1993 | Hosogi | |
| 5,683,547 A * | 11/1997 | Azuma et al. | 438/695 |
| 5,849,371 A * | 12/1998 | Beesley | 427/566 |
| 6,039,000 A * | 3/2000 | Libby et al. | 118/723 E |
| 6,261,938 B1 * | 7/2001 | Beauvais et al. | 438/607 |
| 6,387,530 B1 | 5/2002 | Liu et al. | |
| 6,497,194 B1 * | 12/2002 | Libby et al. | 118/723 FI |
| 6,677,586 B1 | 1/2004 | Nasser-Ghodsi et al. | |
| 6,751,516 B1 | 6/2004 | Richardson | |
| 6,843,927 B2 | 1/2005 | Nasser-Ghodsi | |
| 6,943,350 B2 | 9/2005 | Nasser-Ghodsi et al. | |
| 7,094,312 B2 * | 8/2006 | Libby et al. | 156/345.39 |
| 7,238,294 B2 * | 7/2007 | Koops et al. | 216/62 |
| 2001/0052577 A1 | 12/2001 | Aki et al. | |
| 2001/0055649 A1 * | 12/2001 | Ogure et al. | 427/248.1 |
| 2002/0067482 A1 * | 6/2002 | Lanio et al. | 356/402 |
| 2003/0000921 A1 | 1/2003 | Liang | |
| 2003/0066749 A1 | 4/2003 | Golovchenko et al. | |
| 2004/0033425 A1 * | 2/2004 | Koops et al. | 430/5 |
| 2004/0084407 A1 * | 5/2004 | Makarov et al. | 216/62 |
| 2004/0084408 A1 * | 5/2004 | Makarov et al. | 216/62 |
| 2004/0129351 A1 * | 7/2004 | Iwasaki | 148/508 |
| 2005/0072753 A1 * | 4/2005 | Koops et al. | 216/2 |
| 2006/0192141 A1 * | 8/2006 | Koops | 250/492.1 |
| 2008/0011718 A1 * | 1/2008 | Koops et al. | 216/94 |

FOREIGN PATENT DOCUMENTS

| | | |
|---|---|---|
| DE | 4435043 A1 | 4/1996 |
| DE | 19609234 A1 | 9/1997 |
| DE | 100 42 098 A | 3/2002 |
| JP | 60-167316 | 8/1985 |
| JP | 60-198827 | 10/1985 |
| JP | 61-234038 | 10/1986 |
| JP | 62-076521 A | 4/1987 |
| JP | 02-183530 | 7/1990 |
| JP | 02-205682 A | 8/1990 |
| JP | 03-054824 A | 3/1991 |
| JP | 08-017704 | 1/1996 |
| WO | WO 02 19375 A | 3/2002 |

OTHER PUBLICATIONS

Koops et al "Miniature low voltage beam systems producable by combined lithographies" Nuclear Instruments & Methods in Physics Research-A, 1995, pp. 1-9, Nr. 1, Bd. A363, XP004009614, ISSN: 0168-9002, North-Holland Publishing Company. Amsterdam, NL.

Koops et al. "Construction of a three-dimensional microtriode by nanolithography with electron-beam induced deposition" Vacuum Microelectronics Conference, Jul. 7, 1996, pp. 458-462, XP010232233, ISBN: 0-7803-3594-5, IVMC' 96., 9th International St. Petersburg, Russia Jul. 7-12, 1996, New York, NY, USA, IEEE, US.

ISR PCT/EP02023217, Apr. 29, 2003, Koops.

ISR PCT/EP02010233, Apr. 28, 2003, Koops.

Koops, High-Resolution Electron-Beam Induced Deposition, Journal of Vacuum Science: Part B, 1988, pp. 477-481, V 6, No. 1, American Institute of Physics, New York, US.

Haight et al., MARS: Femtosecond laser mask advanced repair system in manufacturing,J. Vac. Sci. Technol. B17(6), Nov./Dec. 1999, 3137-3143, 17(6),American Vacuum Society.

Ehrlich et al., A Review of Laser-Microchemical Processing, J. Vac. Sci. Technol. B, Oct.Dec. 1983, 969-984, vol. 1, No. 4, American Vacuum Society.

IBM Technical Disclosure Bulletin "Repair System for Masks" May 1993, pp. 279-280, vol. 36, No. 05, IBM Armonk, New York US.

Liang, Ted; Stivers, Alan; "Damage Free Mask Repair Using Electron Beam Induced Chemical Reactions" 1-10, 2001 Intel Corporation, Santa Clara, California.

* cited by examiner

METHOD AND DEVICES FOR PRODUCING CORPUSCULAR RADIATION SYSTEMS

The invention pertains to a process for the production of particle beam systems.

Particle beam systems comprise in particular electron beam and ion beam systems. In the following, electron beam systems, their applications, and their disadvantages are explained by way of example. This explanation is not, however, to be considered limiting. On the contrary, the following discussion also applies to other types of particle beams systems such as the previously mentioned ion beam systems.

Electron beam systems are used, for example, in semiconductor technology, nanoanalysis, bionanophysics, micro-optics, and nanoelectronics. They can be used in particular for the production of nanostructures, that is, for the nanostructuring of surfaces by electron beam-induced lithography. Ion beam and electron beam systems are also used to repair photomasks, phase-shifting photomasks, and NGL masks for the semiconductor industry. With electron beams it is also possible to write integrated circuits directly onto semiconductor wafers and also to repair such circuits. This technique is preferably used for integrated circuits with structural dimensions in the nanometer range, where the previously used methods of optical and ion-beam lithography run up against their physical limits.

An electron beam system comprises a large number of electronic components such as those required for beam current stabilization, beam deflection, automatic focusing programmed sequences, electron-beam deflection and amplification, and secondary-electron beam amplification. These components have conventionally been designed in most cases in the form of individual circuit boards with separate circuits, which can be programmed to carry out the previously mentioned functions.

To reduce the size of electron-beam systems, it is known that the individual elements of the electron beam systems can be built by electron beam-induced deposition. Field electron emitters, field emission cathodes with extractor and focusing lenses, and wire lenses for electrostatic focusing and deflection, for example, can be fabricated in this way. The production of a miniature electrostatic lens by electron beam-induced deposition is described, for example, in DE 44 35 043 A1. DE 44 35 043 A1 is incorporated by reference hereto and discloses as set forth in its first claim "Procedure to produce an electrostatic miniaturized lens having in several planes positioned electrostatic electrodes, characterized in the way that the aperture are composed by conducting Deposit structures or pole wires (1, 2, 3, 1', 2', 3') which are produced using corpuscular induced deposition lithography on top of lithographically in planar technology generated voltage feed lines (4, 5, 6,) placed on an insulating substrate, and the apertures (1, 2, 3, 1', 2', 3') having circular shape or polygon orientation." It is known from DE 44 16 597 A1 that particle beam-induced deposition can be used to apply a plurality of micro-miniaturized electron beam-emitter systems to a substrate structured with conductive patterns in the conventional manner for a flat color screen. DE 44 16 597 A1 is incorporated herein by reference hereto and discloses as set forth in its first claim: "Method to produce the picture elements sources for flat panel screen using focused multiple radiation systems and additive corpuscular deposition lithography on top of an insulating base material, characterized in a way that at first on top of a vacuum tight, insulating base material a first pattern of voltage and current conducting lines is generated using known lithographic methods (light, X-Ray or corpuscular beam lithography), secondly in a second raster emitter wires having incorporated current limiting resistors and metallic emitter tips are produced, and in a third pattern extractor wires are deposited having opposite inclination to the normal or are axially misplaced to the emitter as extractor wires."

For the purpose of miniaturization, electron-beam systems have also been built out of individual mechanical parts, but these systems are not operated with cold field-electron emission but rather with hot electron emission. Work has also begun on constructing miniaturized electron-beam columns. Various research groups are also working on building electron sources from carbon nanotubes and other emitters such as doped silicon tips with transistor-controlled emission current, these sources being produced on a semiconductor chip in a single sequence of steps.

The disadvantage of the processes mentioned above, however, is that it takes a very long time to produce a large number of miniaturized particle beam systems. A very long production time is required, because each system is constructed or produced individually in succession. Another disadvantage is that the production steps of semiconductor manufacturing are subject to such wide tolerances that the field emitters do not show uniform emission characteristics.

A process for the production of particle beam systems and a device for the production of particle beam systems of the general type in question are known from DE 196 09 234 A1. DE 196 09 234 A1 is incorporated herein by reference hereto and discloses in its first claim: "Tube systems consisting of multi electrode arrangements with any combination of electrodes, connections, and functions, that are encapsulated in an evacuated vessel that is hermetically sealed, characterized in the way that the electrodes and the interval between them are selected so as to be so small that in the middle only a median free track length of the molecules at normal pressure fits between the emitter and anode electrodes; in that the electrodes that conduct the voltage are made so as to be close together and the conductor tracks are made so as to be far apart, the cathodes/emitters are formed in needle form and are nanocrystalline or configured as super tips on blunt prefabricated tips or electrodes; and in that the evacuated vessel contains residual gases of particularly defined types in particularly defined pressure ranges" ... and in its third claim "A fabrication process for tube systems, characterized in that nanocrystalline material is assembled on an insulating medium that is prefabricated in planar technology using lithography by means of computer controlled corpuscular-beam induced deposition, in part simultaneously and in part in sequential steps, with nanometer precision, to form electronic assembly groups and circuits in a pre-determined wiring plane, whilst at the same time the operating type of the tubes is determined by the type and pressure of the residual gasses." The device consists here of one or more parallel-connected field-emission or field-ionization cathodes for electrodes or ions, a grid electrode with one or more annular apertures, and one or more anodes. All the electrodes are built up in succession or simultaneously by means of particle beam lithography with indexed deposition on a flat conductive pattern, which supplies the voltages. The electrode spacing is made so small that, on average, only a mean free path length of the molecules can pass between the emitter and the anode at normal pressure. With particle beam-induced deposition, it is possible to build conductive and insulating wires in two and three dimensions. The deposition process, which is carried out under computerized control, can therefore produce 3-dimensional structures to serve as electrodes for the microtubes and tube systems which generate the individual beams, and a large number of these structures can be produced adjacent to each other.

The task of the present invention is to provide a process for the production of particle beam systems and a corresponding device which make it possible to build a large number of miniaturized particle beam systems in the shortest possible time.

This task is accomplished by a process for the production of particle beam systems.

One of the essential ideas of the invention is that a large number of miniaturized particle beam systems can be obtained by using the systems to reproduce themselves. This can be done by using previously produced particle beams systems to produce additional particle beam systems by particle beam-induced deposition.

For example, it is possible according to the invention to use electron beam-induced deposition under computer control to produce large numbers of miniaturized electron-beam systems. A basic circuit produced by lithography using the VLSI technique can be used as a basis and starting point. The functional elements for producing an additional miniaturized electron-beam system are then incorporated into this basic circuit by electron beam-induced deposition. After this miniaturized system has passed a function test, it is used to build in turn the functional elements for a similar electron-beam system on another previously prepared basic chip by electron beam-induced deposition. An essential property of the electron-beam system is that it is able to focus a fine electron beam onto a substrate, and when appropriate organometal compounds are supplied, it is able to generate new structures on that substrate by electron beam-induced deposition. In a first step to double the number of electron beam systems, the inventive process for the self-reproduction of electron beam systems can now use the previously described process:

(a) to produce an electron beam system representing a "daughter" generation and (b) to use the "daughter" electron beam system together with the "mother" electron beam system in parallel to build a second daughter generation of what consists now of two electron beam systems in parallel. These newly built electron beam systems are then connected in parallel to the previously existing electron beam systems, as a result of which four electron beam systems are obtained, which are used jointly to build the functional elements of another four electron beam systems in parallel and simultaneously on prepared basic chips on a substrate, and so forth.

The invention offers the possibility of being able to achieve an exponential increase in the number of particle beam systems. For example, after five generations, 32 functional, miniaturized particle beam systems are obtained, which are tested and ready to operate. After ten daughter generations, there are already 1,024 of these miniaturized systems, and after 20 generations there are 1 million functioning particle beam systems. In particular, the particle beam systems thus obtained are connected to each other in a block and are used as a beam matrix with, for example, up to 1 million particle beams acting productively in parallel, with the advantageous result that novel equipment can be obtained for the production of new products too expensive to be manufactured individually. The reason for this is that production by the single-beam process requires a long time, perhaps as long as several minutes, and thus leads to high costs. The products in question, therefore, cannot be manufactured economically. Examples of such products include the resistance matrices of detector elements for flat cameras for multimedia applications and the emitter-extractor arrangements for the pixel radiation sources of flat field-electron emitters, which are used in flat-screen displays and which can also be used to advantage in high-current switches with low switching voltage in the area of energy transmission engineering.

In concrete terms, the invention pertains to a process for the production of particle beam systems, in which at least one first particle beam system is produced on at least one first substrate by means of a first particle beam system using particle beam-induced deposition, and at least one second particle beam system is produced on at least one second substrate by the minimum of one first particle beam system using particle beam-induced deposition.

Then, at least one additional first particle beam system can be produced on the first substrate by the minimum of one second particle beam system using particle beam-induced deposition.

The production of a first particle beam system by a second particle beam system already present on a substrate preferably alternates with the production of a second particle beam system by a first particle beam system already present on a substrate.

In particular, a first substrate and a second substrate are arranged with an offset from each other in such a way that free surfaces of one substrate are opposite the particle beam systems already present on the other substrate, so that the particle beam systems of the one substrate can produce particle beam systems on the free surfaces of the other substrate.

To achieve the accuracy required for production, the substrates are preferably positioned under computerized control.

An especially high degree of positioning accuracy can be obtained by using piezoelectric elements to position the substrates with respect to each other especially with the use of an x-y-z sliding table. Mechanical sliding tables whose movements can be monitored by linear scales also provide the precision required for the placement of the system components.

Each particle beam system is preferably tested electrically after it has been produced, so that any defects which may be present can be detected during the production process itself.

In a preferred embodiment of the inventive process, circuit elements, especially wiring elements, are produced before the particle beam systems are built up on the substrates, these wiring elements serving to connect and to drive at least some of the particle beam systems produced.

In particular, particle beam systems are produced at contact points provided on the substrate.

An especially efficient production process can be achieved by arranging the particle beam systems like the teeth of a comb on the substrate. Because of the small dimensions of the systems, the gaps between them are less than 50 μm.

It is advantageous to use the gaps between the systems for the electrostatic shielding of the individual systems from each other with the help of electrodes and conductive patterns to which a defined DC or AC voltage is applied.

The first and/or second particle beams systems preferably evaluate the image signals produced by scanning, so that the production process can be monitored visually.

The particle beam is preferably focused, stigmated, and deflected in an automatic sequence. Each particle beam system can be focused individually.

In a preferred embodiment, deposition is carried out by ion beam-induced deposition. Alternatively, deposition by electron beams can be used.

The deposition required for the first particle beam system to be produced is preferably accomplished by microscopic scanning probe deposition at low voltage in the range from approximately 100 V, for example, to approximately 40 kV.

The particle beam systems are preferably driven and controlled in groups by a control system comprising electronic control and programming circuits.

It is advantageous to build up to a certain number of completely configured particle beam systems and then to use them in blocks, in which the particle beam systems work in parallel, to construct additional particle beam systems by the suitable supply of gases.

In particular, individual "combs" of particle beams systems are reproduced and combined to form fabrication systems.

Such systems can be used to produce blocks of systems in a single step, there thus being no need to assemble them by combining smaller systems.

In an especially preferred exemplary embodiment, the particle beam systems are arranged so that the axes of their particle beams are more-or-less perpendicular to the surface of the substrate or substrates. In particular, the particle beam systems comprise one or more field emitter electron sources with at least one extractor, which is designed as a round lens or as a quadrupole, and a focusing lens, which is also designed as a round lens or quadrupole. The arrangement of round lenses or quadrupoles means that the emission current can be controlled and the particle beam focused and deflected in the x-y direction by using a computer to adjust the voltage supplied to the round lens electrodes or quadrupole electrodes.

In particular, the voltages at the electrodes can be selected in such a way that the particle beam can be turned on and off by the round lens or quadrupole system. By applying deflecting voltages to the extractor and the focusing lens, furthermore, it is possible to make the electron beam scan either line by line, in a spiral pattern, with some other random or specifically desired coordinate values, or from one specific point to another.

Wires which detect secondary electrons and/or metal surfaces which accept the secondary electrons produced on the opposite substrate by the primary beam or particle beam are preferably placed around a particle beam system. The wires or metal surfaces act as open multipliers which amplify the secondary electrons and send them synchronously for deflection to an image signal display device or to some other suitable read-out device.

In particular, the image signals and secondary signals of the secondary electrons are used for process control and image display.

The beams of the particle beam systems are preferably used to construct additional particle beams systems, daughter systems, or beam sources, which are produced in particular on a prestructured semiconductor circuit, which is set up at a predetermined distance and which can be positioned by means of a sliding x-y-z table. The semiconductor circuit is preferably prestructured with terminals, deposition base points, and electronic system components in the form of semiconductor circuits.

In particular, the new daughter structure has the same design as the mother arrangement so that it can produce copies of the mother arrangement.

In a preferred embodiment, the daughter structure has a different design, but it is also built to produce a specific type of particle beam system, so that it can be used to produce multiple copies of different types of particle beam systems on the substrates, which can then be used to perform various functions. It is possible in this way to produce, for example, the microtubes patented by the inventor for electron amplifiers in the THz range; circuits for bit error rate measurement sites for telecommunications in the upper GHz range; and high-current electron sources for fast, low-power switching of very high currents for energy distribution applications.

So that the deposition process will proceed uniformly at all points, the gases required for deposition are preferably introduced between the opposing substrates at sufficiently high pressure.

To prevent ions produced during deposition on the daughter level from being deposited on the mother level and vice versa, care should be taken in the choice of voltages in the systems to ensure that an ion mirror effect occurs, which keeps these ions away from the sensitive structures of the mother level or daughter level, respectively, and which collects them effectively through use of suitable potentials in suitable areas provided for the purpose and thus renders them harmless. Such areas can be, for example, lens electrodes or prefabricated collecting surfaces, which are at negative potential with respect to the impact site of the primary electrons.

The substrates are preferably offset from each other under computer control in such a way that the test structures also present on the substrates, produced by prestructuring lithography and lithographic methods, make it possible to measure and to calibrate the properties of the daughter structures or other special structures which may have been produced.

After the structures have been tested and possibly repaired to make them functional, they are used to double the number of structures. This means that the number of these structures increases exponentially.

The multiple particle beam systems which have been produced are preferably used for the economical production of individual systems, of groups of systems made by dividing the surfaces, or of two-dimensional arrays of such systems.

According to another aspect, the invention pertains to a device for the production of particle beam systems with a first substrate and at least one second substrate, where at least one first particle beam system produced by particle beam-induced deposition is present on the first substrate.

In particular, the first substrate and the minimum of one second substrate are offset from each other in such a way that free surfaces on one of the substrates are opposite the particle beam systems already present on the other substrate. Thus the particle beam systems of the one substrate can produce particle beam systems on the free surfaces of the other substrate.

In a preferred embodiment, the device is characterized by a computer, which is set up for programming so that it can control the arrangement of the substrates especially by the use of a table which can slide in the x, y, and z directions.

In addition, piezoelectric elements are advantageously provided for the substrates so that they can be electrically controlled and measured and thus positioned with respect to each other with high precision.

During the production process, the functionality of the particle beam system is preferably tested by devices provided specifically for the purpose such as image reproduction devices, components for detecting and displaying electrical currents and voltages, and other display devices, all of which are formed on the substrates and electrically connected to allow the testing of each particle beam system.

In an especially preferred embodiment, the first substrate and the second substrate are made of semiconductor material, especially silicon. In this case, the same semiconductor production processes used to produce integrated circuits can be used to produce the electronic components for the particle beam systems on the substrates. If the particle beam systems require high voltages, it is advantageous for the electronic control and measuring circuit to be produced on an insulating substrate such as glass or ceramic by means of standard semiconductor manufacturing processes.

In particular, the substrate advantageously has circuit elements, especially wiring elements, by means of which at least some of the particle beam systems can be connected electrically.

In particular, the circuit elements can include, for example, computer-controlled particle beam current controllers, heating current controllers, particle beam deflection amplifiers, aperture deflection amplifiers, scanning generators, function generators with memory, lens adjusting means, lens voltage amplifiers, image signal amplifiers, astigmatism voltage amplifiers, and/or deflecting voltage amplifiers.

For a particle beam system, a substrate typically has at least one surface with a width of approximately 2 μm to approximately 2,500 μm and a length of approximately 10 μm to approximately 100 mm.

In a preferred embodiment, furthermore, a substrate has connection points for particle beam systems in the form of metallized electrical contacts, to which the components of the particle beam system can be connected.

The particle beam systems are preferably arranged next to each other like the teeth of a comb, which is especially advantageous in terms of production technology, because the substrates can be arranged side by side, and all of the particle beam systems of the one substrate, working simultaneously, can be used to produce particle beam systems on the opposing substrate, also with a comb-like design. Arranging the systems like the teeth of a comb on the substrate offers the advantage of compatibility with the connection technology based on the use of circuit board plugs and sockets used in industry for the testing and operation of the fabricated components.

In a preferred embodiment, at least one first and at least one second particle beam system are provided with measuring and stabilizing circuits, which are used to measure and to stabilize the particle radiation.

In a preferred embodiment, furthermore, circuit elements are provided which supply the particle beam systems with voltage and current and which make it possible to program their settings on the basis of data stored in memory. This programmability offers a high degree of flexibility in the production of particle beam systems.

The particle beam systems are preferably provided with means designed to execute automated testing procedures, which ensure the functionality and stability of the radiation and of image reception and image evaluation.

The particle beam systems are advantageously connected to image-display means consisting of a screen or large-format screen, divided into parts in correspondence with the individual particle beam systems, so that the work of each system can be monitored and its results made available for other uses.

The image-display means are provided in particular with data-reduction routines to assist the monitoring process and to ensure that essentially the only data which are stored are error data.

The particle beam systems preferably have electron sources or ion sources of the gas or liquid type.

Finally, the invention pertains to the use of the inventive process and of the inventive device for the production of two-dimensionally distributed structural components, especially for the production of resistance matrices for flat cameras, of flat display screens with particle beam sources, of lens arrays, of read/write arrangements for memory units, and of components for the other previously mentioned applications.

Additional advantages and possible applications of the present invention can be derived from the following description in conjunction with the exemplary embodiments illustrated in the drawings.

The terms and reference symbols listed at the end are used in the following description, in the claims, in the abstract, and in the drawings.

In the drawings.

In the following, the same elements and elements which are functionally the same can be designated by the same reference symbols.

Figure 1:
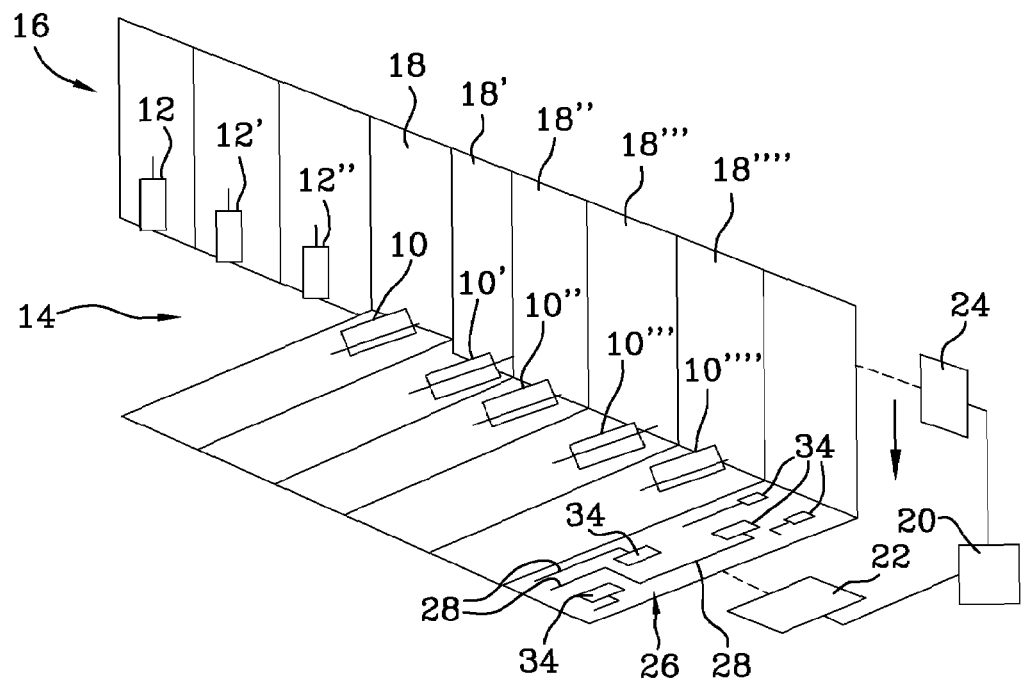
FIG. 1 shows a schematic diagram of an inventive process for the serial production of miniaturized electron-beam systems with the help of prefabricated circuits and electron beam-induced deposition for the construction of functional groups of particle beam systems.

A special feature of the inventive process is characterized by the use of computer-controlled electron beam-induced deposition. Thus, for example, a miniaturized electron-beam system can be produced in about 20-30 minutes on a first prepared base chip serving as the first substrate, which carries stabilizing, control, evaluation, and other circuits. The production technique used for this purpose is a repair technique, which makes it possible to correct errors and to eliminate defects in the deposited structures. This technique is used to build a first electron beam system. Then the required supply voltages are applied to turn the system on. After it has been turned on, the system thus produced is tested electronically.

The elements of the first electron beam system, produced by deposition and consisting of electrostatic lenses and an imaging system equipped with a beam deflector and possibly with an aperture, make it possible to focus a beam of high current density at a short working distance. It is therefore possible to use electron beam-induced deposition to deposit the structural elements of a second electron beam system on a second base chip serving as a second substrate.

To build the second electron-beam system, the second base chip is aligned with nanometer precision with respect to the first base chip by mechanical positioning or placement devices. With the help of image-processing means, the mix-and-match method is used to produce the electrodes of the second electron beam system on the second base chip, the positioning of the electrodes being accurate to the nanometer. Thus a second electron beam system comprising a source, a capacitor, possibly an aperture, a deflection system, a deflecting lens, and a detector are produced, the system having an overall length of 1-100 μm.

This miniaturized electron-beam system makes it possible to focus an electron beam of 20-100 eV through the last lens of the system at a working distance of a few μm. The focusing can become as fine as that of a conventional 20-kV electron-beam system, because the lens defects of the miniaturized electrostatic lenses made of conductive wires are much smaller than those of the conventional large electrical and magnetic lenses of a 20-kV electron-beam system. Accordingly, the aberrations are orders of magnitude smaller. A miniaturized electron-beam system of this type therefore makes it possible to obtain the same resolution as that of a conventional 1-meter electron-beam system with an aperture of the same size.

The inventive production of large numbers of miniaturized electron-beam systems is advantageously improved by the use of robots to position the substrates on which the systems are built. There are two different processes which can be used to accomplish this.

In a first process, a conventional scanning-electron beam system is used, which is equipped with a special multi-channel gas feed system for supplying the precursors required for the deposition process. To obtain the new electron beam system, the original scanning-electron beam system produces an electrode configuration, an electron source, possibly an aperture, a deflecting lens, and a detector on a specific base chip of the first substrate by building up material on prepared contact points of the specific base chip. This electron beam system is now used to build up a second electron beam system on another prepared base chip in the same way, namely, by deposition-writing in the direction perpendicular to the substrate. The two chips are then set up next to each other, supplied with voltage, and connected to form a double writing unit. With a double system of this type, two additional electron beam systems can be produced. Overall, therefore, $2^n$ electron beam systems can be produced over the course of "n" system generations.

A second process consists in using a scanning-electron beam system to produce a first electron beam system on one of the base chips of a first, comb-like substrate, which has a plurality of base chips arranged like the teeth of a comb. A second substrate, also with a comb-like design, is then set up opposite the first substrate. More precisely, it is set up at an angle of approximately 90° to the first substrate. The second substrate is then moved mechanically relative to the first substrate in such a way that the first electron beam system produces the electron source, the electrodes, and the additional functional elements of a second electron beam system on the second substrate.

When this second or "daughter" electron beam system is produced, it is supplied with current like the first electron beam system and used to write another first electron beam system on a second base chip of the first substrate, after the first substrate has been moved mechanically relative to the second substrate in such a way that a free surface, i.e., a base chip, is facing the second or "daughter" electron beam system.

After this operation, there are two parallel electron beam systems on the first substrate, which are used in turn to produce two more electron beam systems on the second substrate. For this purpose, the two parallel electron beam systems of the first substrate write two additional systems onto the second substrate arranged at approximately a right angle to the first substrate, with the result that there are now three electron beam systems on the second substrate. These three electron beam systems are used in turn to produce three electron beam systems on the first substrate, so that there is now a total of five systems on the first substrate.

FIG. 1 shows a first substrate 14 and a second substrate 16, on which first and second miniaturized electron beam systems 10, 10', 10'', 10''', 10'''', and 12, 12', 12'' are located. The two substrates 14, 16 are designed like the teeth of a comb; that is, they have an approximately rectangular shape and are divided into free surfaces corresponding to the base chips which are provided for the electron beam systems. The substrates 14, 16 are arranged at an angle of approximately 90° to each other. Their positions are adjusted by a (control) computer 20, which drives piezoelectric elements 22 and 24 to align the substrates 14, 16 precisely with respect to each other. Thus it is possible to position the substrates 14, 16 with nanometer accuracy.

The electron beam systems 10-10'''' and 12-12'' were produced according to the inventive process as follows: First, a scanning-electron writer (not shown) was used to produce the first electron beam system 10 on the first substrate 14 by electron beam-induced deposition. Then, the second substrate 16 was aligned by the computer 20 and the piezoelectric element 24 with respect to the first substrate 14 in such a way that the base chip for the second electron beam system 12 was opposite the first electron beam system 10. Then the first electron beam system 10 produced the second electron beam system 12. After it was completed and tested successfully, the second electron beam system 12 was put into operation and produced the first electron beam system 10' next to the electron beam system 10 on the first substrate, after the appropriate base chip of the first substrate 14 had been positioned opposite the second electron beam system 12. The two adjacent electron beam systems 10 and 10' were then used to produce the electron beam systems 12' and 12'' after appropriate positioning of the two substrates 14 and 16. Finally, the three adjacent electron beam systems 12-12'' thus produced were used to deposit the electron beam systems 10''-10'''' simultaneously. In a next step, the electron beam systems 10-10'''' will then simultaneously produce five (not shown) electron beam systems on the second substrate 16. In the figure, the substrates 14, 16 are already positioned appropriately for this purpose. The base chips, i.e., the free surfaces 18-18'''' for the electron beam systems to be produced on the second substrate are still free.

Another free surface at the right edge of the first substrate 14 shows a schematic diagram of the circuit elements 26 provided for the electron beam system. The circuit elements 26 comprise wiring elements 28, especially conductive pathways, and contact points 34, especially free metal surfaces. The contact points 34 are the points on which the structures of the electron beam system such as its lenses and apertures are grown. The wiring elements 28 serve to establish electrical connections between the electron beam system and other circuit elements (not shown), such as power or voltage sources.

Figure 2:
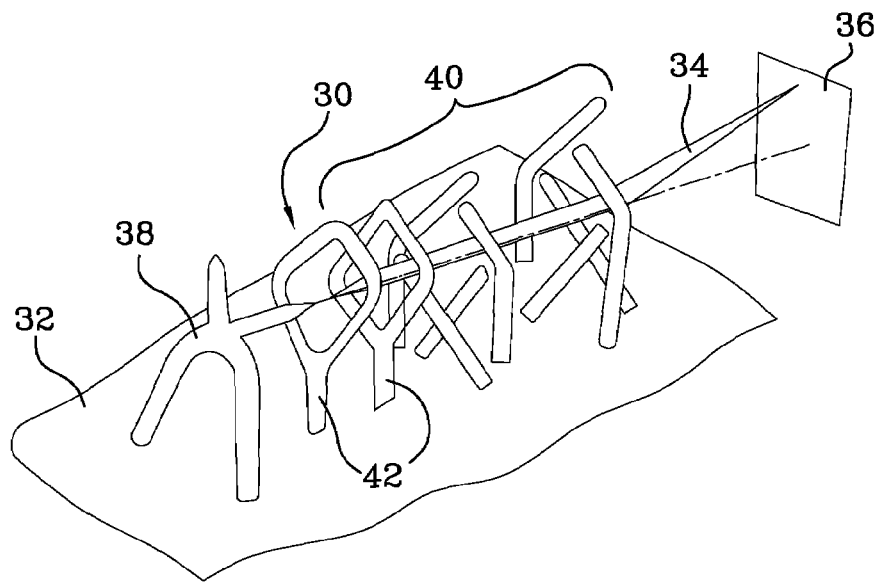
FIG. 2 shows a schematic diagram of an individual electron-beam system, which was built on a predetermined surface of a substrate by electron beam-induced deposition according to the invention.

FIG. 2 shows a complete electron beam system 30 on a surface 32 of a substrate, such as that produced by the inventive process on a base chip. The electron beam produced by the system 30 strikes an object 36, which can be, for example, another base chip of a substrate, on which an additional electron beam system is to be built. The object 36 is arranged approximately at an angle of 90° to the system 30 and is positioned more-or-less at the focal point of the electron beam 34.

The electron beam system 30 shown comprises an emitter 38 and a system 40 of apertures and lenses, including an extractor lens consisting of two ring-shaped electrodes. An aperture is not shown. This would have to be located in the space between the extractor lens and the deflector lens. Because the field electron source is in the form of a "supertip"

on the emitter carrier and because the defects of the extractor lens are very small, it is possible to make complete use of the emission, which is limited to a single emission source point, without the need for an aperture and without causing significant impairment to the size or emittance of the source. In addition, the focus of the beam can be regulated by the round lens part of the deflector lens. An electron beam system 30 of this type is used to produce a "daughter" electron beam system on the object 36 by electron beam-induced deposition according to the invention.

With the process described above, a special mathematical series of growth numbers is created for the electron beam systems, which leads to the reproduction of multiple electron beam systems in a manner similar to exponential growth. The inventive process offers the advantage that two functional substrates can be used to fill each other successively with electron beam systems and that it is thus possible to obtain substrates completely filled with electron beam systems very quickly. To obtain, for example, 64 or 1024 or even 1 million miniaturized electron beam systems, the substrates with their parallel electron beam systems can be used as a whole to produce new "daughter" electron beam systems simultaneously on a new substrate.

The second process has the advantage over the first process that the substrates with the electron beam systems do not have to be cut apart into individual elements. It is also advantageous that the wiring for the supply voltages and for other electrical control steps operating in parallel are integrated into the substrate during the production process itself. Thus the packaging of individual components is rendered unnecessary, and the reliability of the arrangement is significantly increased.

Figure 3:
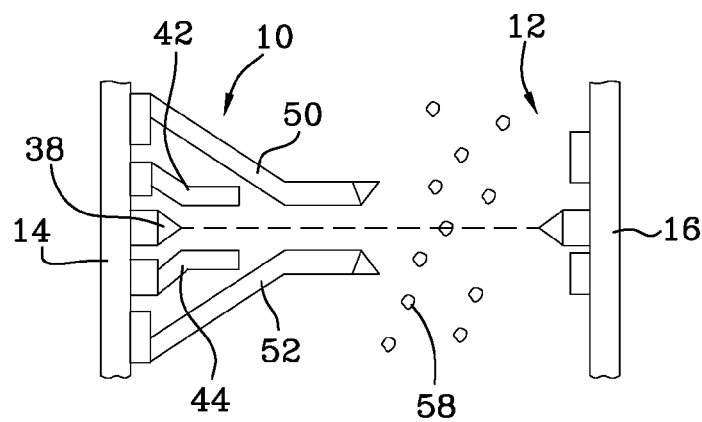
FIG. 3 shows a side view of an electron-beam system, the beam axis of which is perpendicular to the substrate.

FIG. 3 shows a side view of a first electron beam system 10 on a first substrate 14, the electron beam of which, suggested in broken line, is more-or-less perpendicular to the substrate 14. The electron beam of the first system 10 builds a second electron beam system 12 by means of electron beam-induced deposition on the second substrate 16, which is opposite the first substrate 14. Between the two plate-shaped substrates 14 and 16 there is a gas, the gas particles 58 of which are required for the deposition process. The gas between the substrates 14 and 16 is at a pressure high enough for the deposition.

Figure 4:
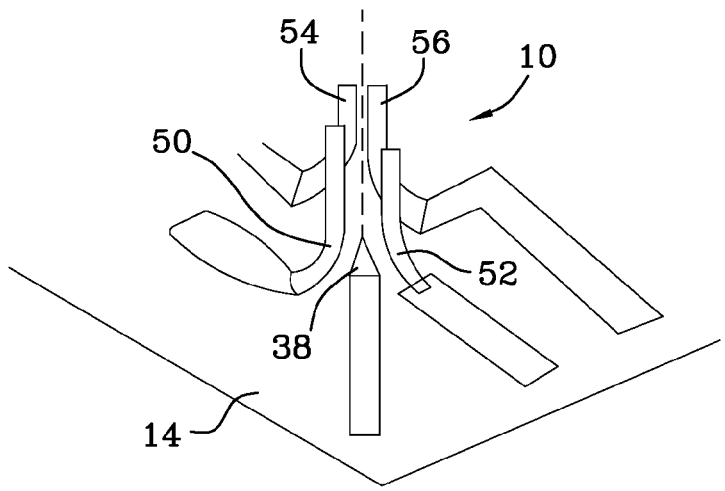
FIG. 4 shows a perspective view of the electron-beam system shown in FIG. 3.

The first electron beam system 10 comprises a fine metal tip as an emitter 38 for electrons. The first system 10 also has a first quadrupole with the electrodes 44 and a second quadrupole with the electrodes 50, 52. The other two electrodes belonging to the second quadrupole in the plane passing through the beam axis perpendicular to the plane of the drawing cannot be seen here, but they can be seen in the following FIG. 4, which shows an oblique view of the first quadrupole, and also in FIG. 6, which shows the points at the bases of the electrodes 43, 44, 46, 48 and 50-56 where they are connected to the conductive pathways of the connecting structure. The first quadrupole 43, 44, (46, 48 not shown) serves as an extractor, which accelerates the electrodes emitted by the emitter 38. The second quadrupole 50, 52 (54, 56 not shown) is downstream from the first quadrupole 43, 44 in the direction proceeding from the first substrate 14 to the second substrate 16 and serves as a focusing lens for the electron beam. The emission current of the emitter 38 can be varied by computer-controlled adjustment of the supply voltage to the electrodes of the two quadrupoles 43, 44 and 50, 52; that is, the electron beam can be focused and deflected in the x-y direction, where the x-y plane is more-or-less parallel to the planes in which the substrates 14, 16 lie. FIG. 4 shows a perspective view of the first electron beam system 10 illustrated in FIG. 3. In addition to the electrodes 50, 52, 54, 56 of the second quadrupole, the emitter 38 can also be seen. The first quadrupole of FIG. 3 is not visible in this view.

Figure 5:
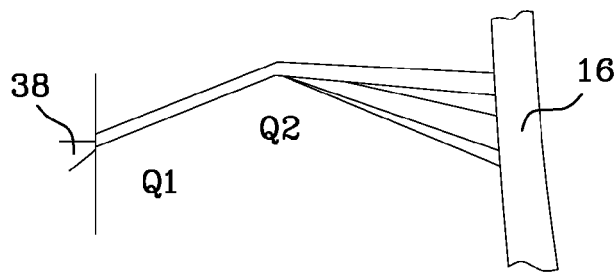
FIG. 5 shows the various potentials of the electron beam emitted by the electron-beam system illustrated in FIGS. 3 and 4.

FIG. 5 shows the potentials of an electron beam emitted by an emitter 38. The potential Q1 is present at the tip of the emitter 38. When the electron beam emerges from the electron beam system, it has a potential Q2, which is determined essentially by the second quadrupole. The electron beam strikes the second substrate 16 with a stopping potential. This stopping of the primary electrons has the effect of accelerating the secondary electrons which have been separated from the substrate and brakes the separated ions, so that they cannot reach the field emission cathode. In another advantageous embodiment, the potential values Q1 and Q2 can also be exchanged, in which case the stopping potential nevertheless remains the same.

Figure 6:
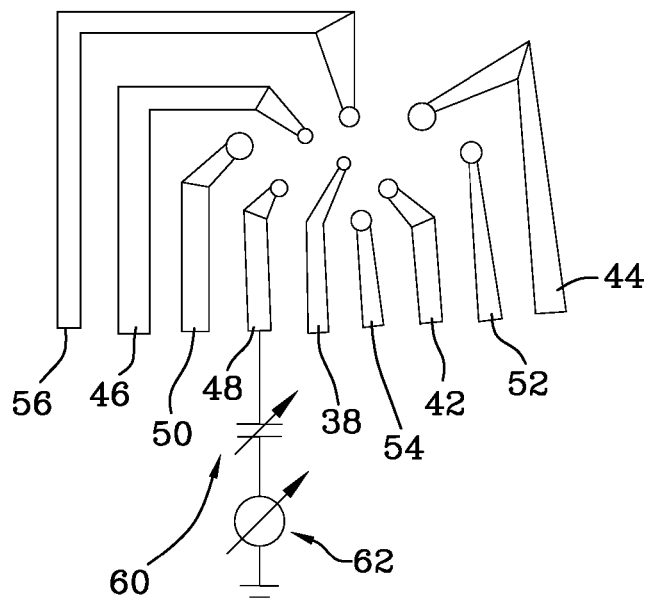
FIG. 6 shows a plan view of the electron beam system shown in FIG. 3.

FIG. 6 shows a plan view of the electron beam system 10. In this diagram, all of the electrodes of the system can be seen. The first quadrupole is formed by the electrodes 43, 44, 46, 48, and the second quadrupole is formed by the electrodes 50, 52, 54, 56. The way the electrodes are driven is described by way of example on the basis of electrode 48. The electrode 48 is driven by a variable voltage source 60, which is connected to ground by way of an ammeter 62. The potential of the electrode 48 can be adjusted by the use of the variable voltage source 62. The electrodes 50, 52 54, 56 are also used as traps for secondary electrons. All the signals of the electrodes 50, 52, 54, 56 are added by a summation amplifier instead of by the individual ammeters, one of which is provided for each electrode, as shown by way of example at 48. This summation value is used for image evaluation. The build-up of the second electron beam system 12 on the second substrate 16 can thus be monitored visually, in that the brightness of the write beam of a picture tube traveling in synchrony with the x-y deflection is modulated by the amplified secondary electron signal.

Figure 7:
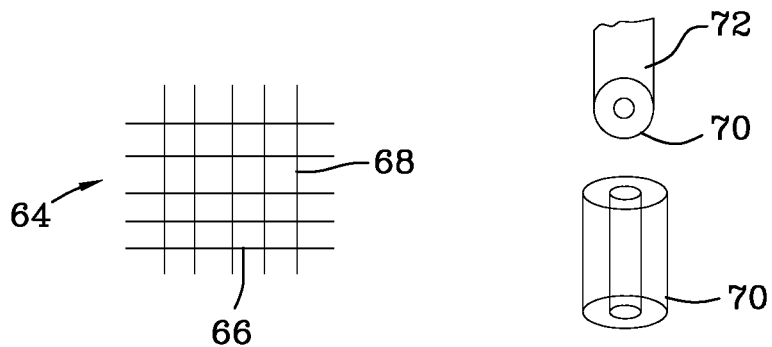
FIG. 7 shows a grid for deflection and calibration and, adjacent to it, a cylinder structure produced by electron-beam deposition for forming a Faraday cage to measure current.

FIG. 7 shows a grid 64 for the deflection calibration of electron beams. This grid 64 can also be used to measure astigmatism by a Moiré process, in that the electron probe is passed at a very low angle along the edge of a bar of the grid, and the distance required to move the probe all the way onto the bar or all the way off the bar can be determined from the number of transverse bars visible in the secondary electron signal. The resolution of the method is proportional to 1/angle between the direction of probe movement and the bar of the grid. The article "Metrology Chip for Measurement of Diameter and Astigmatism of an Electron Beam with nm Resolution Using Moiré Amplification" by H. W. P. Koops, B. Hübner, and M. Watanabe in *Microelectronic Engineering*, Vol. 23, pp. 387-390, 1994, describes in greater detail how the grid is used to measure and calibrate the astigmatism. The grid 64, which has transverse and longitudinal bars 66, 68, is arranged on a substrate and serves essentially as a calibration pattern and detector surface for measuring current. It thus has the cylinder 70, shown on the right in FIG. 7, next to the grid 64. The cylinder 70, the height of which is much greater than its diameter, is produced by deposition. The cylinder forms a Faraday cage for current measurement and is thus in contact with the conductive pathways 72 of the grid 64.

Figure 8:
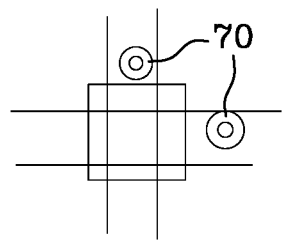
FIG. 8 shows a detailed view of the grid shown in FIG. 7 with cylinder structures like the one illustrated in FIG. 7.

The detailed view of the grid 64 in FIG. 8 shows how the cylinders 70 are arranged with respect to the grid.

The growth of a large number of electron beam systems according to the invention makes it possible to use many independently guided, local electron beam systems to fabricate other systems by means of electron beam-induced deposition. Because of the size of these miniaturized systems, a beam density in the range of approximately 250 µm or less is achieved, this dimension corresponding to the distance between beams along a comb-like substrate. By laying such substrates carrying electron beam systems on top of each other, a distance of again approximately 250 µm, for example, can be achieved between beams in the direction perpendicular to the comb, which is more-or-less equivalent to the thickness of the semiconductor carrying the electron control circuitry. This is the same as the thickness of the silicon wafer from which the substrates carrying the base chips were produced. A beam density with a spacing of approximately 250×250 µm on a surface area of approximately 30 mm×30 mm means that 1,440 beams can be made available for the production of two-dimensional arrays of components with this type of grid spacing.

For example, the grid matrix can be used to produce a resistance matrix for a flat camera by electron beam-induced deposition, and these matrices can be mass-produced. Another advantageous application of these types of parallel-beam systems is the production of flat picture screens with electron sources. Each of the electron sources consists in this case of an emitter and an extractor. Thus only two wire electrodes must be produced, one of which has a fine tip. This also applies to the production of lens arrays by exposure to electron beams and other deposition and exposure structures which must be distributed two-dimensionally in a grid pattern. Because they contain their own independent detectors, systems of this kind with a parallel arrangement of electron beams can also be used to measure structures. In this way, the acceptance of high-resolution electron beam metrology in semiconductor manufacturing industry can be greatly increased.

An array of electron beam systems produced by the inventive process makes it possible for electron beam lithography structures to be written at much higher speeds, because the process eliminates the need for the overall electron flow to pass through a single optical system. Instead, when the electron beam systems are arranged in a grid, the electron beam flow passes through $2^n$ optical systems (where n generations of electron beam systems have been produced by the inventive process according to the above-described first or second variant). As a result, the write time t can be reduced to $t/2^n$, which is highly advantageous for the lithography of large areas, especially for the lithographic production of nanostructures in cases where, for example, masks are to be written or wafers exposed directly for the production of integrated circuits.

Another advantageous application of a large number of electron beam systems is to be found in memory technology. For this purpose, the electron beam systems are designed in such a way that, through the deflection of their electron beams in a grid field with a size of, for example, 100 µm×100 µm, they can produce and also access memory elements, which can be either electrical or magnetic memory cell elements, measuring about 30 nm in diameter. The content of the memory cells can be read through suitable evaluation of the beam response in the form of back-scattered or reflected electrons, and data can be stored without the use of moving parts. 9 million memory cells can be accommodated in an area of approximately 100 µm×100 µm, for example. With 1,000 electron beam systems produced by the inventive process and working in parallel, for example, it would be possible to access 9 Gbits. In addition, through the use of write and read beams working in parallel, the data transmission rate can be increased beyond that of conventional storage systems such as DRAM chips or even hard disks. Simultaneously, the use of mechanically moving parts is avoided, which increases the reliability of the overall system.

LIST OF REFERENCE SYMBOLS 10-10'''' first electron beam system
12-12'' second electron beam systems
14 first substrate
16 second substrate
18-18'''' free surfaces
20 computer
22, 24 piezoelectric elements
26 circuit elements
28 wiring elements
30 electron beam system
32 surface
34 contact points
36 object
38 emitter
40 lens system
42 extractor lens
43 electrode of the first quadrupole
44 electrode of the first quadrupole (extractor lens)
46 electrode of the first quadrupole (extractor lens)
48 electrode of the first quadrupole (extractor lens)
50 electrode of the second quadrupole (focusing and deflecting lens)
50 electrode of the second quadrupole (focusing and deflecting lens)
52 electrode of the second quadrupole (focusing and deflecting lens)
54 electrode of the second quadrupole (focusing and deflecting lens)
56 electrode of the second quadrupole (focusing and deflecting lens)
58 gas particle
60 variable voltage source
62 ammeter
64 grid
66 transverse bars
68 longitudinal bars
70 cylinder (Faraday cage)
72 conductive pathway

The invention claimed is:

1. Process for the production of particle beam systems (10-10'''', 12-12'') in which at least one first particle beam system (10) is formed on a first substrate (14) by particle beam-induced deposition, characterized in that at least one second particle beam system (12) is produced on at least one second substrate (16) by the minimum of one first particle beam system (10) using computer-guided, particle beam-induced deposition, whereupon the minimum of one second particle beam system (12) is used to produce at least one additional first particle beam system (10') on the first substrate (14) by computer-guided particle beam-induced deposition.

2. Process according to claim 1, characterized in that first and second particle beams systems (12', 12'', 10', 10''', 10'''') are produced in alternation by the second and first particle beam systems, respectively, already existing on the substrates (14, 16).

3. Process according to claim 1, characterized in that the first and the second substrates (14, 16) are offset from each other in such a way that free surfaces (18-18'''') of one substrate (16) are opposite the particle beams systems (10-10'''') already existing on the other substrate (14), so that the particle beam systems (10-10'''') of the one substrate (14) can produce particle beam systems on the free surfaces (18-18'''') of the other substrate (16).

4. Process according to claim 3, characterized in that the substrates (14, 16) are positioned under the control of a computer (20).

5. Process according to claim 3, characterized in that said substrates (14, 16) are positioned with respect to each other by piezoelectric elements (22, 24).

6. Process according to claim 1, characterized in that: before said particle beams systems are produced on said substrates, circuit elements (26), especially wiring elements (28), are produced, by means of which at least some of said particle beam systems are electrically connected; and each said particle beam system (10-10'''', 12-12'') is tested electrically after it is produced.

7. Process according to claim 1, characterized in that: said particle beam systems are produced on contact points (34) provided on said substrate (14); and said particle beam systems are arranged next to each other like the teeth of a comb on a substrate.

8. Process according to claim 1, characterized in that said first and/or second particle beam systems evaluate image signals produced by scanning.

9. Process according to claim 1, characterized in that: the focusing, stigmation, and deflection of the particle beam are carried out in an automatic sequence, and in that each particle beam system is focused individually; and the deposition is carried out by computer-guided ion beam-induced or electron beam-induced deposition; and the deposition of the first particle beam system to be produced is carried out by deposition with a computer-guided microscopic scanning probe at low voltages of approximately 100 V to approximately 40 kV.

10. Process according to claim 1, characterized in that: a certain number of particle beam systems are produced and completely configured, whereupon these particle beam systems, which are arranged in blocks, are suitably supplied with gases and work in parallel to produce additional particle beam systems; and the particle beam systems are driven and controlled in groups by a control system comprising electronic control and programming circuitry.

11. Process according to claim 10, characterized in that: individual comb-like arrays of particle beam systems are reproduced, assembled into fabrication systems, and configured; the blocks are all produced together in a single process, without the need for further assembly; and, the beam axes of the particle beam systems (see FIGS. 3-6) are substantially perpendicular to the surface of the substrate.

12. Device for the production of particle beam systems (10-10'''', 12-12''), with a first substrate (14), where at least one first particle beam system (10-10''''), produced by computer-guided particle beam-induced deposition, is located on the first substrate (14), characterized in that at least one second substrate is provided; in that the first and the minimum of one second substrate (14, 16) are arranged at an offset from each other in such a way that free surfaces (18-18'''') of one substrate (16) are opposite the particle beam systems (10-10'''') already present on the other substrate (14), so that the particle beams systems (10-10'''') of the one substrate (14) can produce particle beam systems on the free surfaces (18-18'''') of the other substrate (16).

13. Device according to claim 12, characterized by a computer (20), which is set up for programming in such a way that it can control the positioning of the substrates (14, 16).

14. Device according to claim 13, characterized by: piezeoelectric elements (22, 24) for the substrates (14, 16), which make it possible to position the substrates with respect to each other under computer control after evaluation of the image of the free base points; testing means, such as means for image reproduction, means for detection and display of electrical current and secondary electron values, and other display means, which are designed to test each particle beam system (10-10'''', 12-12'') on the substrates (14, 16); and, the first and second substrates (14, 16) are semiconductors, especially silicon.

15. Device according to claim 12, characterized in that the first and second substrates (14, 16) are nonconductors, especially glass, ceramic, or quartz.

16. Device according to claim 12, characterized in that the substrate has circuit elements (26), especially wiring elements (28), by means of which at least some of the particle beam systems are electrically connected.

17. Device according to claim 16, characterized in that the circuit elements comprise in particular computer-controlled particle beam current controllers, heating current controllers, particle beam deflection amplifiers, aperture deflection amplifiers, scanner generators, function generators with memory, lens adjusting means, lens voltage amplifiers, image signal amplifiers, astigmatism voltage amplifiers, and/or deflection voltage amplifiers.

18. Device according to claim 16, characterized in that: the circuit elements are in particular computer components such as central processing units, computer memory, cache memory, data memory, and circuits which perform routines stored in hardware, namely, the routines which make possible and are required for the reproduction of the systems, for image acquisition and evaluation, and for the production of special new systems; the circuit elements which make possible and are required for the reproduction of the systems, for image acquisition and evaluation, and for the production of special new systems can be added sequentially by the multiplex method to the particle beam systems to be individually fabricated so that these systems can be controlled; and in order to hold a particle beam system (30), a substrate has a surface (32) with a width of approximately 2 μm to approximately 2,500 μm and a length of approximately 10 μm to approximately 100 mm; and a substrate (14) has contact points (34) for particle beam systems; and particle beam systems are arranged next to each other like the teeth of a comb on a substrate; and at least one first and at least one second particle beam system are equipped with measuring and stabilizing circuits, which serve to measure and to stabilize the particle beam radiation; and, circuit elements are provided which supply the particle beam systems with voltage and current and which can be adjusted and programmed by data in memory.

19. Device according to claim 12, characterized in that the particle beam systems are provided with means designed to execute an automated testing procedure, which ensures the functionality and stability of the radiation, of image recording, and of image evaluation.

20. Device according to claim 12, characterized in that: the particle beam systems are connected to image display means such as picture screens or large-format screens, where the image is divided in correspondence with the individual particle beam systems, so that the work of the system can be monitored and the results made available for use elsewhere; the particle beam systems have electron sources or gas or liquid ion sources; and, the image display means have data-reduction routines to support the monitoring process and to guarantee that essentially the only data which must be stored are error data.

* * * * *

UNITED STATES PATENT AND TRADEMARK OFFICE
CERTIFICATE OF CORRECTION

PATENT NO.         : 7,504,644 B2                                   Page 1 of 1
APPLICATION NO. : 10/543175
DATED              : March 17, 2009
INVENTOR(S)        : Hans Wilfried Peter Koops It is certified that error appears in the above-identified patent and that said Letters Patent is hereby corrected as shown below:

Claim 11, col. 15, line 45, after "systems" delete "(see FIGS. 3-6)".

Signed and Sealed this

Twenty-first Day of April, 2009

JOHN DOLL
*Acting Director of the United States Patent and Trademark Office*